(12) United States Patent
Lakshmikumar et al.

(10) Patent No.: US 11,811,375 B2
(45) Date of Patent: Nov. 7, 2023

(54) DIFFERENTIAL TRANSIMPEDANCE AMPLIFIER EMPLOYING ASYMMETRIC SIGNAL PATHS

(71) Applicant: Cisco Technology, Inc., San Jose, CA (US)

(72) Inventors: Kadaba Lakshmikumar, Basking Ridge, NJ (US); Alexander Kurylak, Nazareth, PA (US); Romesh Kumar Nandwana, Breinigsville, PA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 296 days.

(21) Appl. No.: 17/224,497

(22) Filed: Apr. 7, 2021

(65) Prior Publication Data

US 2022/0329222 A1   Oct. 13, 2022

(51) Int. Cl.
*H03F 3/08*        (2006.01)
*H03F 3/45*        (2006.01)
*H03G 3/30*        (2006.01)

(52) U.S. Cl.
CPC ........... *H03F 3/45475* (2013.01); *H03G 3/30* (2013.01); *H03F 2200/129* (2013.01)

(58) Field of Classification Search
CPC ........... H03F 3/45475; H03F 2200/129; H03F 2200/405; H03F 1/083; H03F 3/087; H03F 3/45645; H03F 3/45748; H03F 3/08; H03F 3/082; H03F 3/085; H03G 3/30; H03G 3/001; H03G 1/0047; H03G 3/3084
USPC ................. 330/59, 308; 250/214 A, 214 AG
See application file for complete search history.

(56) References Cited

U.S. PATENT DOCUMENTS

| 7,505,696 | B2 * | 3/2009  | Day ......................... H03F 1/32 |
|           |      |         | 375/345 |
| 8,471,639 | B2   | 6/2013  | Welch |
| 8,907,729 | B2 * | 12/2014 | Temporiti Milani ...................... |
|           |      |         | H04B 10/693 |
|           |      |         | 330/308 |
| 10,171,051 | B2 * | 1/2019 | Oku ..................... H04B 10/693 |
| 10,348,257 | B2 * | 7/2019 | Welch ..................... H03F 3/087 |
| 10,505,509 | B2   | 12/2019 | Lakshmikumar et al. |
| 2003/0219260 | A1 | 11/2003 | Chiou et al. |

(Continued)

FOREIGN PATENT DOCUMENTS

CN        109039473 A       12/2018

OTHER PUBLICATIONS

Joris Lambrecht et al., "A 106-Gb/s PAM-4 Silicon Optical Receiver", IEEE Photonics Technology Letters, vol. 31, No. 7, Apr. 1, 2019, DOI: 10.1109/LPT.2019.2899147, IEEE, 4 pages.

(Continued)

*Primary Examiner* — Khanh V Nguyen
(74) *Attorney, Agent, or Firm* — Edell, Shapiro & Finnan, LLC

(57) ABSTRACT

An asymmetric signal path approach is used to extract differential signals out of the photodetector (e.g., a photodiode) for amplification by a differential transimpedance amplifier (TIA). This asymmetric-path differential TIA configuration has less low-frequency Inter Symbol Interference (ISI) (also known as Baseline Wander), less high-frequency noise amplification, and higher bandwidth capabilities. There is no power penalty with this design in comparison to a single-ended TIA, can extend the range of the link for a given system power consumption, and can decrease transmitter power for a given range.

20 Claims, 9 Drawing Sheets

(56) References Cited

U.S. PATENT DOCUMENTS

| | | |
|---|---|---|
| 2004/0130397 A1 | 7/2004 | Mactaggart |
| 2008/0088354 A1* | 4/2008 | Mosinskis |
| 2017/0086687 A1* | 3/2017 | Imai .................... A61B 5/7225 |
| 2020/0091881 A1* | 3/2020 | Lim .................... H03F 3/45475 |
| 2020/0096711 A1 | 3/2020 | Papanikolaou et al. |
| 2020/0110290 A1 | 4/2020 | Nagaraju et al. |

OTHER PUBLICATIONS

Joris Lambrecht et al., "56-Gb/s Silicon Optical Receiver using a Low-Noise Fully-Differential Transimpedance Amplifier in SiGe BiCMOS", 2018 European Conference on Optical Communication (ECOC), Sep. 23-27, 2018, DOI: 10.1109/ECOC.2018.8535469, IEEE, 3 pages.

Bahram Zand et al., "Transimpedance Amplifier With Differential Photodiode Current Sensing", 1999 IEEE International Symposium on Circuits and Systems (ISCAS), May 30-Jun. 2, 1999, DOI: 10.1109/ISCAS.1999.780842, IEEE, 4 pages.

* cited by examiner

DIFFERENTIAL TRANSIMPEDANCE AMPLIFIER EMPLOYING ASYMMETRIC SIGNAL PATHS

TECHNICAL FIELD

The present disclosure relates to amplifier circuitry for optical equipment.

BACKGROUND

A transimpedance amplifier (TIA) is a circuit block useful for optical receivers to convert an optical signal/current into a voltage for further processing. Traditionally, a single-ended TIA architecture is used for Intensity Modulation and Direct Detection (IMDD) links to detect the non-return to zero (NRZ), pulse amplitude modulation (PAM-N) type of signals. The detection capabilities are typically limited by the TIA noise in the receiver chain.

As data rates and bandwidths are increasing for certain applications, the effective TIA noise in the link will increase, resulting in limited signal-to-noise ratio (SNR), increase in power consumption, and reduced range of the link. TIA architectures that can improve the TIA SNR would be quite useful as they could achieve lower power consumption and increased range of the link.

DESCRIPTION OF EXAMPLE EMBODIMENTS

Overview

Figure 1:
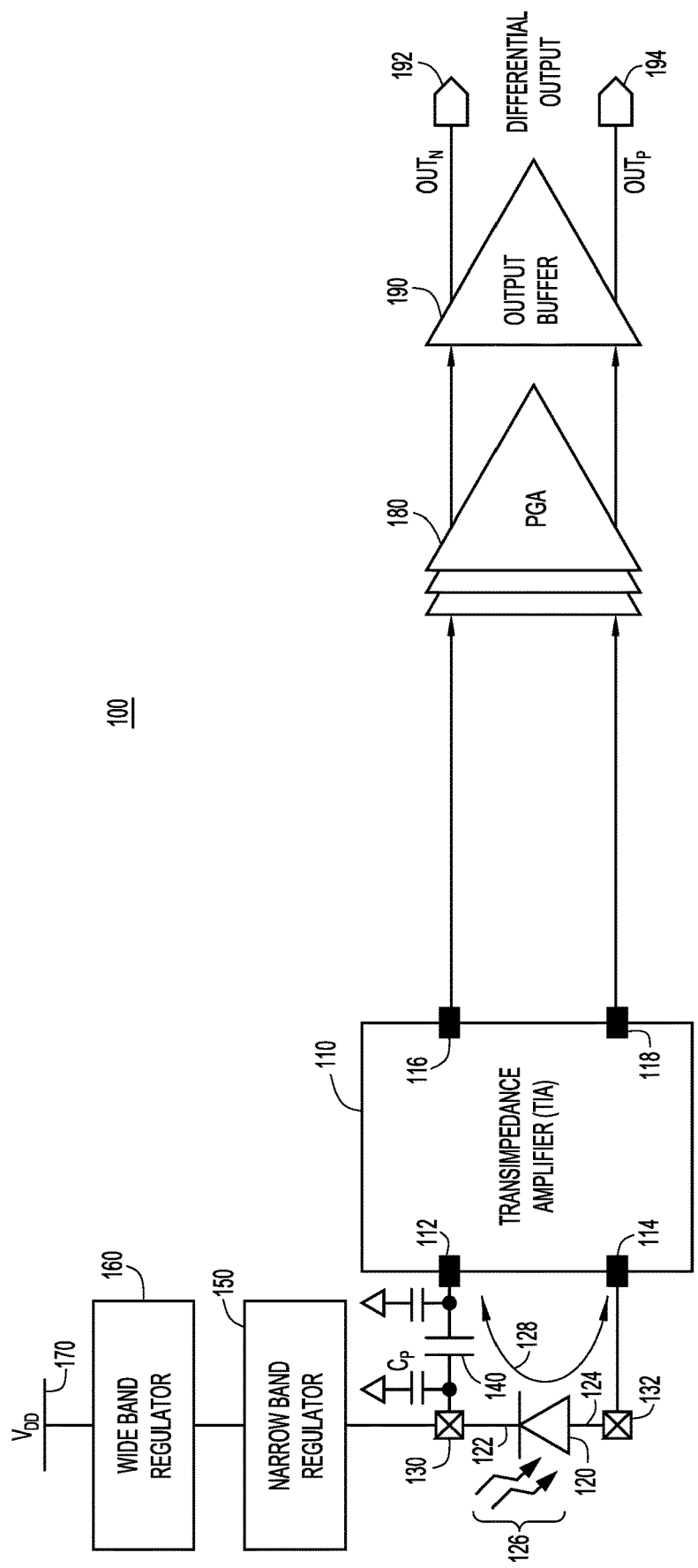
FIG. 1 is a block diagram of an apparatus employing asymmetric signal paths for a differential transimpedance amplifier, according to an example embodiment.

An asymmetric-path differential transimpedance amplifier (TIA) configuration is provided. In one form, an apparatus is provided that comprises a differential transimpedance amplifier having a first input and a second input, and is configured to convert a current signal supplied at the first input and the second input to a differential output voltage provided at a first output and a second output. An AC coupling capacitor is connected between the first input and a cathode of a photodetector. The second input is directly connected to an anode of the photodetector. A narrow band regulator is coupled to the cathode of the photodetector. The narrow band regulator has a frequency dependent impedance that increases with frequency so as to cause more of the current signal from the photodetector to flow into the differential transimpedance amplifier with increasing frequency of the output current of the photodetector.

Example Embodiments

Presented herein are embodiments that build on a unique approach to a differential TIA in which asymmetric signal paths are employed to provide better frequency response and lower noise. A differential TIA structure can improve the receiver SNR and link margin by as much as 3 dB compared to a conventional single-ended TIA.

More specifically, an asymmetric signal path approach is used to extract differential signals out of the photodetector (e.g., a photodiode). This asymmetric-path differential TIA configuration has less low-frequency Inter Symbol Interference (ISI) (also known as Baseline Wander), less high-frequency noise amplification, and higher bandwidth capabilities. Moreover, this design suffers no power penalty in comparison to a single-ended TIA, can extend the range of the link for a given system power consumption, and can decrease transmitter power for a given range.

A single-ended TIA structure involves coupling the TIA to an anode of a photodetector to receive the photodetector current, while the cathode of the photodetector is coupled to an alternating current (AC) ground. A single-ended-to-differential converter is then used to provide differential signals to an analog-to-digital converter (ADC). This conventional design limits SNR performance by the incoming photodetector current and TIA resistor noise.

A fully symmetric signal differential TIA structure is one in which the anode and cathode are coupled directly to differential inputs of a differential TIA. The cathode of the photodetector is also used to generate the electrical signal. In reality, such a fully symmetric differential TIA will not work because the voltage across the photodetector is zero. Moreover, a reverse bias across the photodetector is required for high-bandwidth operations. Even when the photodetector is reverse biased, a symmetric differential TIA will have AC coupling capacitors in both paths which will create a higher high-pass corner frequency. This causes attenuation in both paths, leading to poor low frequency ISI (Baseline Wander). In addition, the parasitic capacitance of each coupling capacitor causes TIA bandwidth reduction and high-frequency noise amplification. Consequently, the SNR improvement of such a symmetric differential TIA design will be much less than the theoretical 3 dB limit.

Accordingly, an asymmetrically-coupled differential TIA structure is presented herein that can achieve SNR improvement much closer to the theoretical 3 dB limit. Reference is now made to FIG. 1, which illustrates an amplification system or apparatus (simply called "apparatus") 100 that may be used as part of an optical receiver to amplify an electrical signal obtained at the output of a device, such as an output of a photodiode (photodetector). The apparatus 100 includes a differential TIA 110 coupled to a photodiode (photodetector or PD) 120 that has a cathode 122 and anode 124. The PD 120 detects light 126 and generates as output an electrical current signal, called a PD current, shown at reference numeral 128.

Figure 2A:
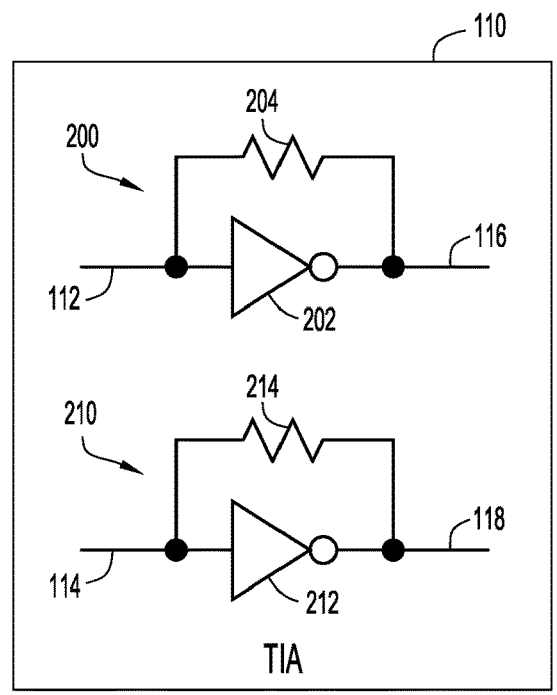
FIGS. 2A and 2B illustrate different forms of the differential transimpedance amplifier, according to an example embodiment.
Figure 2B:
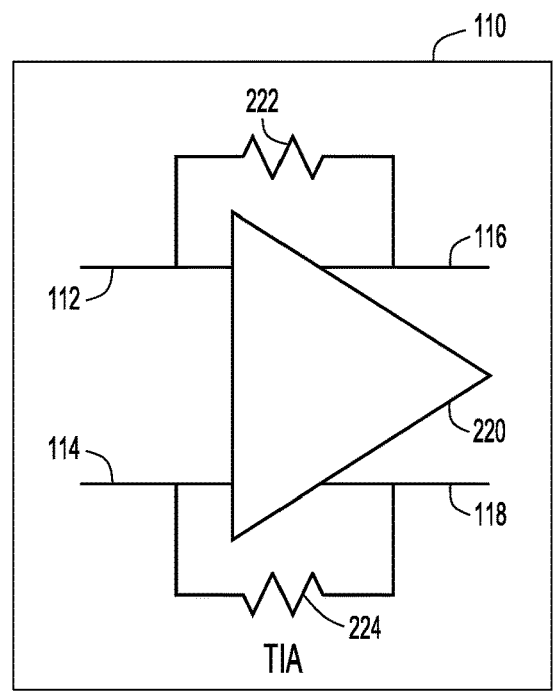

The TIA 110 has differential inputs consisting of a first amplifier input 112 and a second amplifier input 114, and a differential outputs consisting of a first output 116 and a second output 118. Further, the differential TIA can be realized with two identical single ended TIAs as shown in FIG. 2A or by a fully differential topology as shown in FIG. 2B, described below.

The apparatus 100 with the differential TIA 110 includes a first input 130 and a second input 132. The first input 130 is coupled to the cathode 122 of the PD 120 and the second input 132 is coupled to the anode 124 of the PD 120. An AC coupling capacitor 140 is connected at a first end to the first input 130.

The first amplifier input 112 of the TIA 110 is connected to a second end of the AC coupling capacitor 140 and the second amplifier input 114 of the TIA 110 is directly connected to the second input 132 (which is the anode 124 of the PD 120). The differential TIA 110 is configured to convert the PD current 128 obtained at the first amplifier input 112 and the second amplifier input 114 to a differential output voltage at the first and second outputs 116 and 118.

A narrow band regulator 150 may be coupled to the first input 130. The narrow band regulator 150 has a frequency-dependent impedance that increases with frequency so as to cause more of the PD current 128 to flow into the differential TIA 110 with increasing frequency of the PD current 128. In addition, the apparatus 100 may further include a wide band regulator 160 configured to be coupled between the narrow band regulator 150 and a power or voltage supply ($V_{DD}$) 170. The wide band regulator 160 configured to suppress noise of the voltage supply 170. Further details of the narrow band regulator 150 and wide band regulator 160 are provided below in the description of FIG. 3.

The apparatus 100 may further include at least one differential programmable gain amplifier (PGA) 180 coupled to the first and second outputs 116 and 118 of the differential TIA 110. The differential programmable gain amplifier 180 is configured to amplify the differential output voltage to generate differential programmable gain outputs. As shown in FIG. 1, there may be multiple instances of differential programmable gain amplifier 180 (connected in series).

Further, the apparatus 100 may include an output buffer 190 coupled to the differential programmable gain outputs of the at least one differential programmable gain amplifier 180. The output buffer 190 is configured to buffer the differential programmable gain outputs to provide a buffered differential output voltage at first and second differential outputs, 192 and 194, respectively, and also labeled $OUT_N$ and $OUT_P$, respectively.

The PGA 180 and output buffer 190 are optional components in the apparatus 100.

FIG. 1 shows that there are parasitic capacitances, denoted CP, associated with the AC coupling capacitor 140. However, because there is only one AC coupling capacitor 140 in the asymmetric configuration of the apparatus 100, there is a reduced amount of parasitic capacitance compared to existing symmetric designs that employ an AC coupling capacitor for both signal paths into a differential TIA.

As described above, the asymmetric signal paths in the apparatus 100 achieve several advantages. First, low frequency data suffers attenuation in one path only. The net baseline wander is half of that of a design that uses symmetric signal paths. Finally, the effects of parasitic capacitance on bandwidth and noise is in one path only. Again, the SNR improvement that can be achieved with the apparatus 100 featuring the asymmetric signal paths will be much closer to the theoretical 3 dB limit.

Reference is now made to FIGS. 2A and 2B for a description of possible forms of the differential TIA 110. FIG. 2A shows one form of the differential TIA, called a pseudo-differential amplifier that includes first and second branches 200 and 210, respectively, each including a single-ended amplifier and a feedback resistor. Specifically, the first branch 200 includes an amplifier 202 and a feedback resistor 204 coupled from the first output 116 to the first amplifier input 112. Similarly, the second branch 210 includes an amplifier 212 and a feedback resistor 214 coupled from the second output 118 to the second amplifier input 114. Thus, the TIA shown in FIG. 2A is a pseudo-differential TIA that is comprises of a first single-ended amplifier and a second single-ended amplifier.

FIG. 2B shows another form of the differential TIA 110, called a fully-differential amplifier. A fully-differential TIA amplifier has a single amplifier 220 having two inputs corresponding to the first and second amplifier inputs 112 and 114, and two outputs corresponding to the first and second outputs 116 and 118. There is a feedback resistor 222 coupled between the first output 116 and the first amplifier input 112, and a feedback resistor 224 coupled between the second output 118 and the second amplifier input 114.

Figure 3:
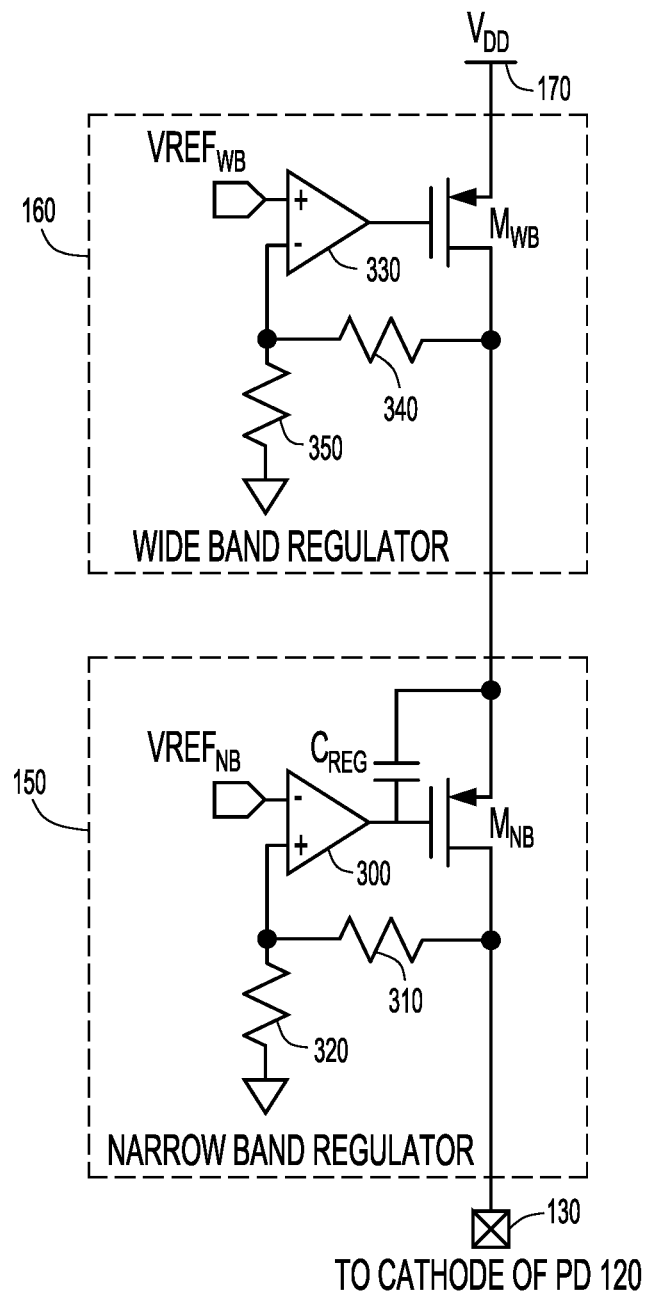
FIG. 3 is a schematic diagram of a narrow band regulator and a wide band regulator that may be used in the apparatus of FIG. 1, according to an example embodiment.

Turning now to FIG. 3, with continued reference to FIG. 1, example schematic diagrams are shown of the narrow band regulator 150 and the wide band regulator 160. The narrow band regulator 150 and the wide band regulator 160 are connected in a cascaded manner where the wide band regulator 160 precedes the narrow band regulator 150 with respect to the power supply $V_{DD}$.

The narrow band regulator 150 provides the DC-bias voltage for the cathode 122 of PD 120, as generally shown in FIG. 1. The narrow band regulator 150 includes an operational amplifier 300 and a P-channel Metal Oxide Silicon (PMOS) pass transistor $M_{NB}$ to bias the cathode 122 of the PD 120. The pass transistor $M_{NB}$ includes a drain coupled to the cathode of the PD 120, a gate and a source. The operational amplifier 300 has a negative (−) input, a positive (+) input and an output. The output of the operational amplifier 300 is coupled to the gate of the pass transistor $M_{NB}$. A feedback resistor 310 (also referred to as $R_{310}$) is connected between the drain of the pass transistor $M_{NB}$ and the positive input of the operational amplifier 300. A second resistor 320 (also referred to as $R_{320}$) is connected between the positive input of the operational amplifier 300 and ground. The negative input of the operational amplifier 300 is coupled to a voltage reference $VREF_{NB}$ representing a narrow band (NB) reference. The voltage generated at the cathode 122 will be $(1+R_{310}/R_{320})*VREF_{NB}$. The gate of pass transistor $M_{NB}$ is connected with to the source via capacitor CREG. This capacitor CREG ensures that above a certain frequency, the gate of the pass transistor $M_{NB}$ is shorted with the source of the pass transistor $M_{NB}$. This shorting allows a high output impedance at the drain node of the pass transistor $M_{NB}$, forcing more of the PD output current to go into the differential TIA amplifier, at higher frequencies of the PD output current.

By systematically designing to have low bandwidth, the narrow band regulator 150 provides low impedance in the lower frequency range (few hundreds of Hz to few hundreds of kHz) ensuring the DC bias of the PD 120, while at the same time providing a frequency dependent higher impedance in a higher frequency range. This higher impedance ensures that the PD output current (the desired signal) sees a high impedance into the narrow band regulator 150, thus forcing more (all) of the PD output current through the AC coupling capacitor 140, which is a relatively low impedance capacitor, to the signal path of the differential TIA 110. This enables the differential TIA to see a maximum amount of PD output current over a wide range of the signal frequencies. In an ideal case, it is desired to minimize the bandwidth of the narrow band regulator 150 to ensure the maximum frequency coverage by the differential TIA signal paths.

The wide band regulator 160 has a similar structure as the narrow band regulator 150. The wide band regulator 160 includes an operational amplifier 330 and a PMOS pass transistor $M_{WB}$ to supply the current to the source of the pass transistor $M_{NB}$ of the narrow band regulator 150. The pass transistor $M_{WB}$ includes a drain coupled to the source of the pass transistor $M_{NB}$ of the narrow band regulator 150, a gate and a source. The source of the pass transistor $M_{WB}$ is connected to the power or voltage supply ($V_{DD}$) 170. The operational amplifier 330 has a negative (−) input, a positive (+) input and an output. The output of the operational amplifier 330 is coupled to the gate of the pass transistor $M_{WB}$. A feedback resistor 340 (also referred to as $R_{340}$) is connected between the drain of the pass transistor $M_{WB}$ and the positive input of the operational amplifier 330. A second resistor 350 (also referred to as $R_{350}$) is connected between the positive input of the operational amplifier 330 and ground. The negative input of the operational amplifier 330 is coupled to a voltage reference $VREF_{WB}$ representing a wide band (WB) reference. The voltage generated at the source of the narrow band pass transistor $M_{NB}$ will be $(1+R_{340}/R_{350})*VREF_{WB}$.

The wide band regulator 160 precedes the narrow band regulator 150, with respect to the power supply $V_{DD}$, and provides noise rejection to the power supply $V_{DD}$, with a wide bandwidth (a few tens of MHz to hundreds of MHz), as the relatively narrow bandwidth of the narrow band regulator 150 prohibits it from performing noise rejection on its own. With the use of the wide band regulator 160 together with a narrow band regulator 150, the impedance requirement and power supply noise rejection trade-off can be alleviated, providing independent controls for impedance bandwidth control and power supply rejection bandwidth.

Direct Current (DC) cancellation may be used in the signal paths to further improve performance. To this end, reference is now made to FIGS. 4A and 4B. DC cancellation involves removing the average value of DC current in the apparatus.

Figure 4A:
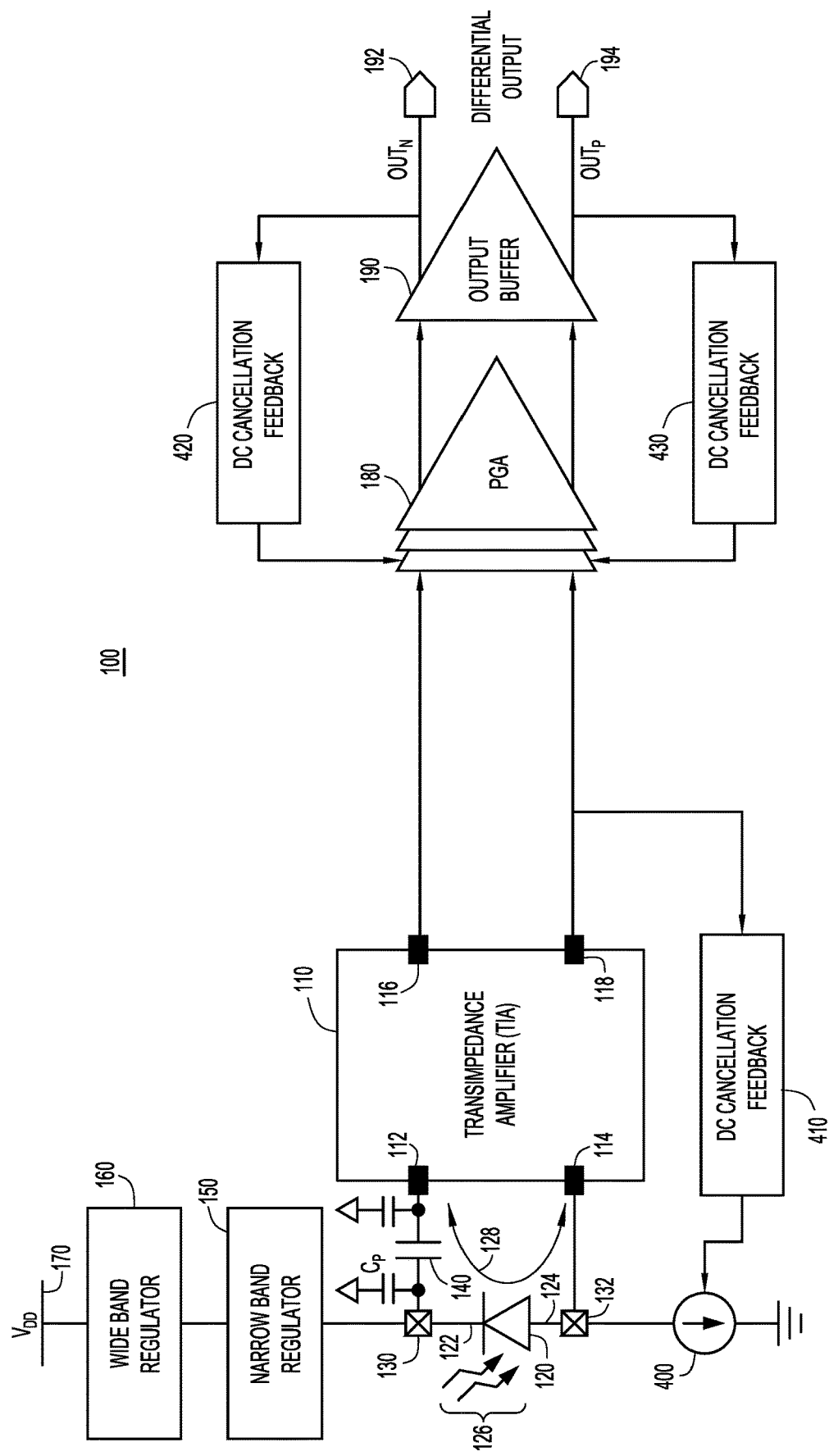
FIGS. 4A and 4B are diagrams depicting configurations to perform DC cancellation in the apparatus, according to example embodiments.

FIG. 4A shows that DC cancellation feedback may be applied in one or more areas of the apparatus 100. A current source 400 is coupled to the anode 124 of the PD 120. The current source 400 is configured to remove DC current from the anode 124 of the PD 120. A DC cancellation feedback circuit 410 is provided that is coupled between one of outputs of the differential TIA 110, such as the second output 118, and the current source 400. The DC cancellation feedback circuit 410 is configured to provide a DC current cancelling control to the current source 400 to control the removal of DC current from the anode of the PD 120.

In addition, there may be a DC cancellation feedback circuit coupled between the differential outputs 192 and/or 194 and the at least one differential PGA 180. For example, a DC cancellation feedback circuit 420 may be provided for the negative signal path between the output 192 and the at least one PGA 180, and a DC cancellation feedback circuit 430 for the positive signal path between the output 194 and the at least one PGA 180. The DC cancellation feedback circuits 420 and 430 provide a DC cancellation control to the at least one PGA 180 to remove DC in one or both of the differential signal paths of the at least one PGA 180. The DC cancellation feedback circuits 420 and 430 can also be used to minimize the impact of random and systematic mismatch of the stages of PGAs and output buffer 190 to further improve the dynamic range performance of the apparatus 100.

Figure 4B:
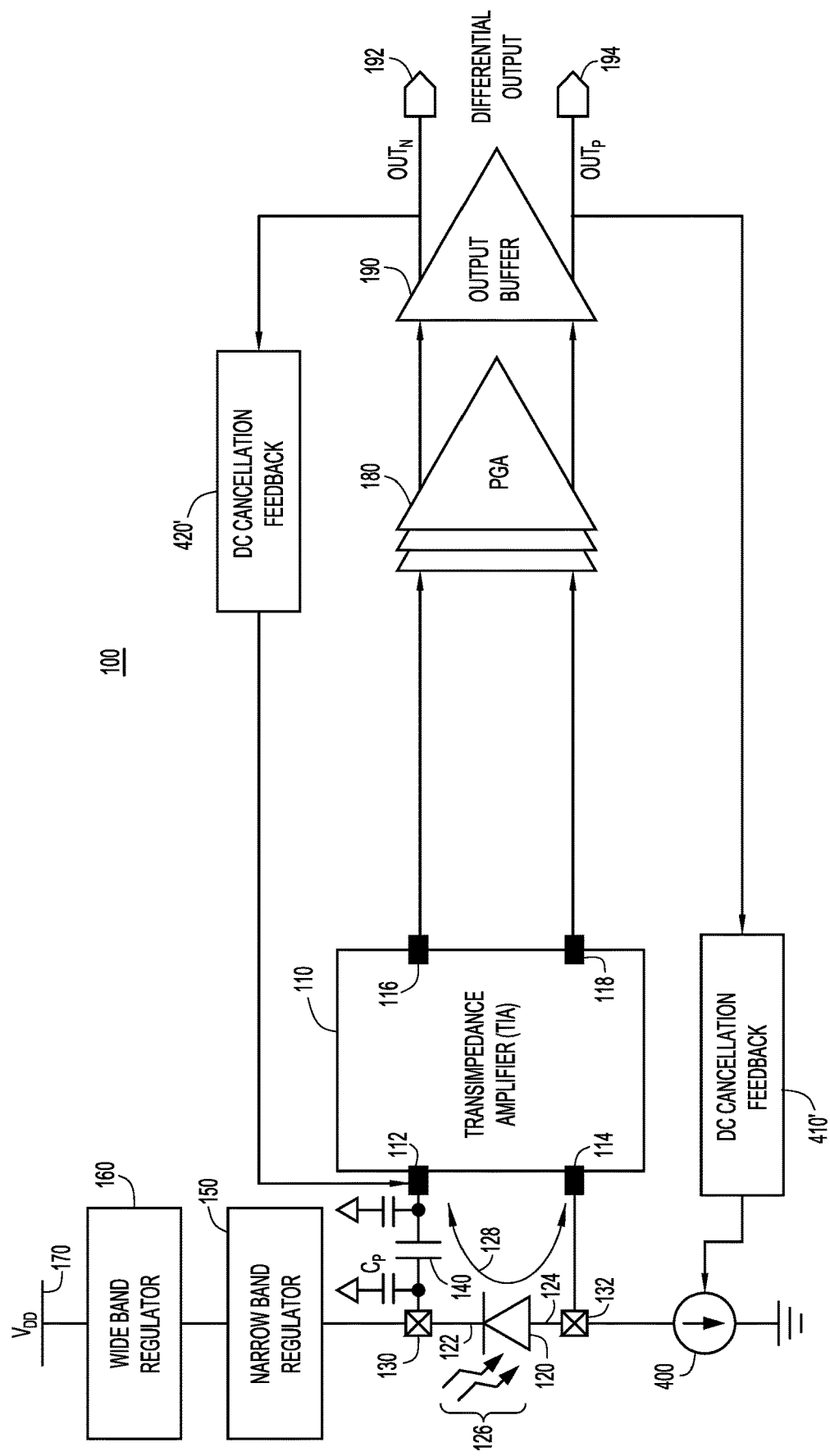

FIG. 4B shows a further variant of DC cancellation feedback involving DC cancellation feedback circuit 410' and 420'. In this variation, the input for DC cancellation feedback circuit 410' is taken from one of the differential outputs of the apparatus 100, e.g., from output 194 of the output buffer 190 instead of from one of the outputs of the differential TIA 110. In addition, the control output of the DC cancellation feedback circuit 420' is coupled to the first input 112 of the differential TIA 110 so as to remove DC current before coupling into the differential TIA 110.

The DC cancellation feedback circuit 410' is useful to remove the average value of the DC current through the PD 120. This feedback loop helps to improve the dynamic range of the differential TIA 110 as the TIA only has to process the wanted signal (AC signal content from the PD 120) and not the unwanted average DC current. The average value of the PD current may be subtracted at the input with the DC cancellation feedback circuit 410 shown in FIG. 4A and/or with the DC cancellation feedback circuits 410' and 420' shown in FIG. 4B.

Figure 5:
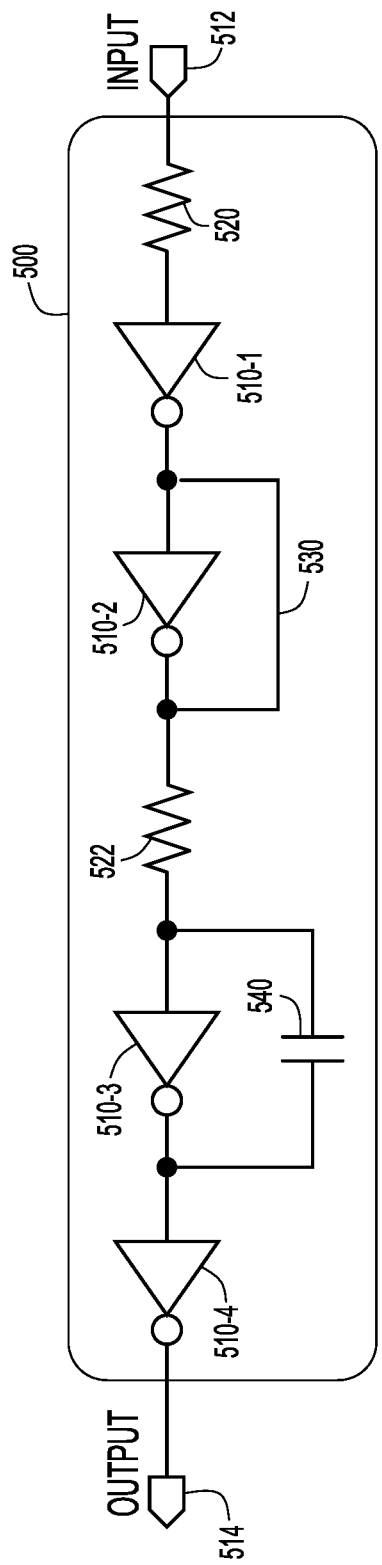
FIG. 5 is a schematic diagram of a DC cancellation circuit that may be used in the configurations of FIGS. 4A and 4B, according to an example embodiment.

FIG. 5 shows an example schematic diagram of a DC cancellation feedback circuit 500 that may be used for the DC cancellation feedback circuits 410, 420, 430 in FIG. 4A and DC cancellation feedback circuits 410' and 420' in FIG. 4B. The DC cancellation feedback circuit 500 includes a plurality of amplifiers 510-1, 510-2, 510-3 and 510-4 coupled between an input 512 and an output 514. There is a resister 520 connected between the input 512 and the amplifier 510-1, and a resistor 522 connected between amplifiers 510-2 and 510-3. In addition, there is a direct feedback connection 530 between the output and the input of amplifier 510-2, and a capacitor 540 connected in a feedback path between the output and input of amplifier 510-3.

In operation, the cascade of the amplifiers (gain stages) 510-1 to 510-4 results in a very high DC gain from the input 512 to output 514. This high gain minimizes any residual DC offset in the loop. The miller multiplication capacitor 540 combined with resistor 522 creates a very low (~tens of kilo hertz) pole so that the transfer function from the photodetector to the output will have a high-pass response with a very low corner frequency. This allows all the signal frequencies to pass to the output of the TIA, minimizing the impact of low frequency ISI (Baseline Wander).

Figure 6:
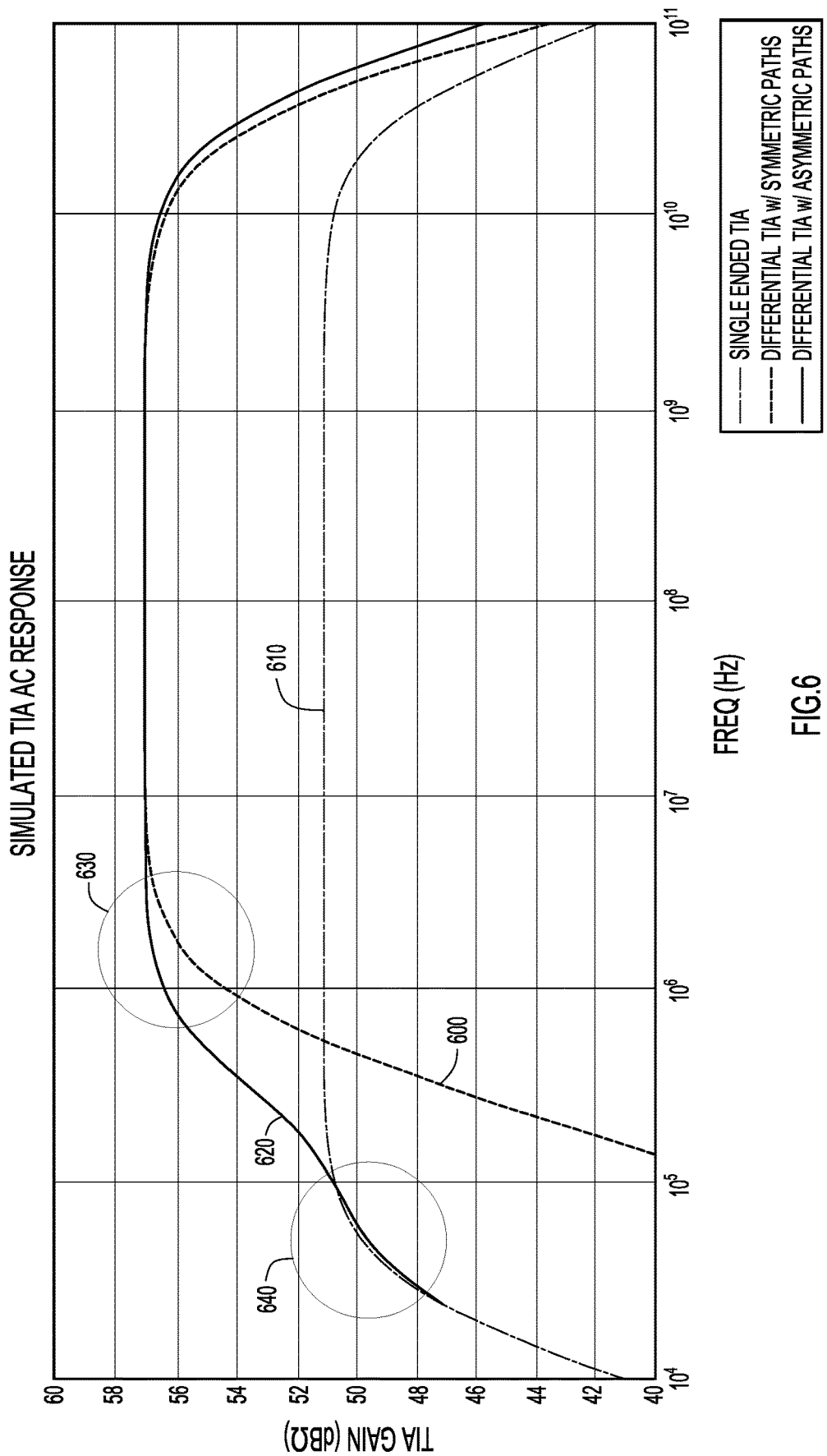
FIG. 6 is a diagram showing improvement of the frequency response achieved using asymmetric signal paths to a differential transimpedance amplifier over the frequency response achieved by symmetric signals paths to a differential transimpedance amplifier.

FIG. 6 shows a comparison of a simulated AC frequency response plot (gain versus frequency) of the apparatus 100 with that of an amplifier configuration using symmetric signals paths, and that of a single-ended TIA design. The curve 600 in FIG. 6 is the frequency response of a differential TIA using symmetric signal paths. The curve 610 is a frequency response of a single-ended TIA. The curve 620 represents a simulated frequency response of the apparatus 100 using asymmetric signal paths to the differential TIA 110. The curves 600, 610 and 620 show that there is a 6 dB higher signal path gain due to differential nature of the apparatus 100 and low-frequency attenuation attributed to the size of the AC coupling capacitor 140 (FIG. 1) is limited to 6 dB. The DC coupled signal path dictates the rest of the low-frequency behavior. The overall high-frequency bandwidth is also greater/higher for the asymmetric signal path design compared to a symmetric path design and comparable to a single ended TIA design. A comparison of the AC coupling roll-off between an asymmetric signal path design and a symmetric signal path design is shown at reference numeral 630. The effects of DC cancellation is shown at reference numeral 640.

Figure 7:
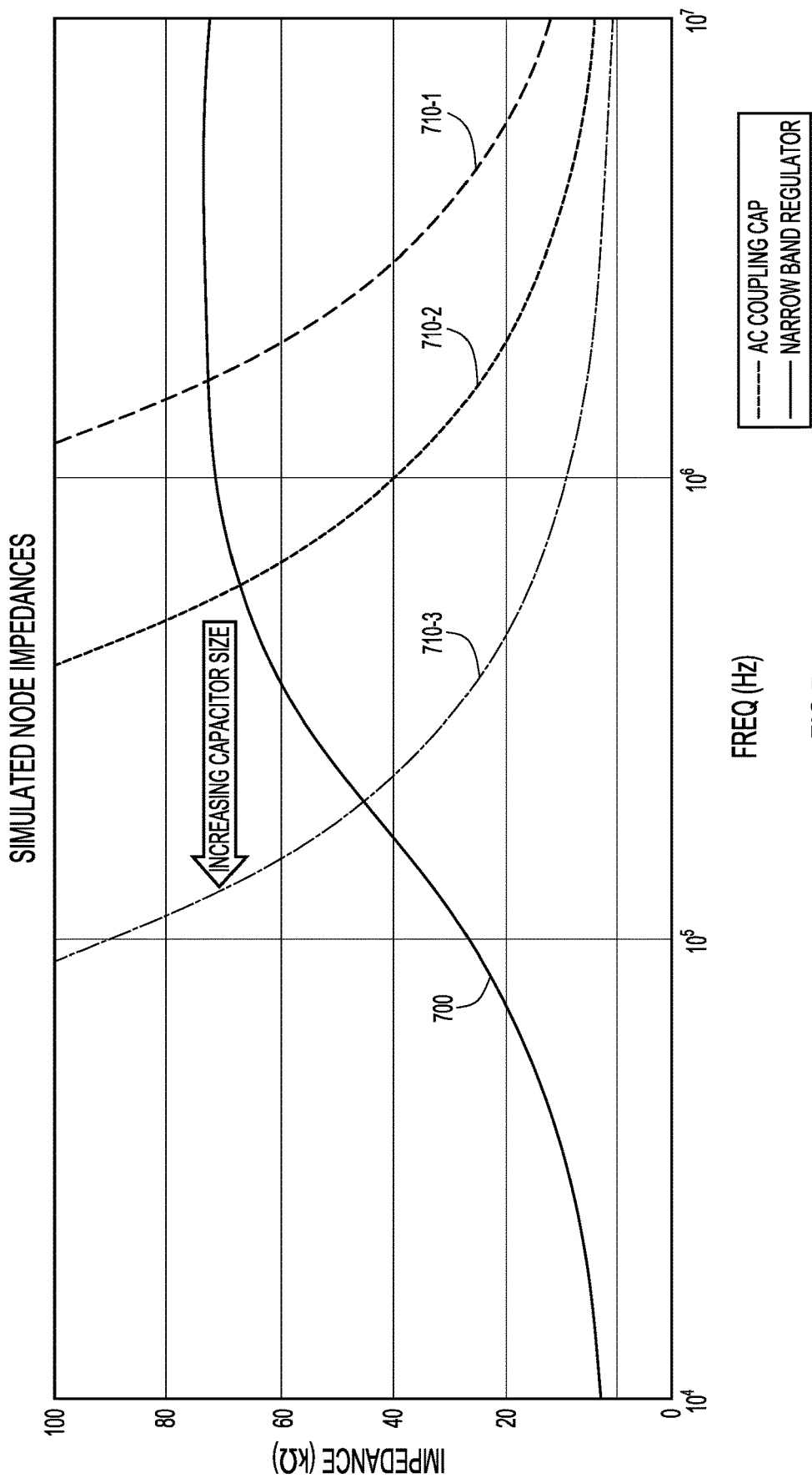
FIG. 7 is a diagram showing the frequency dependence of impedance of the narrow band regulator and of an AC coupling capacitor used in apparatus depicted in FIG. 1, according to an example embodiment.

Turning to FIG. 7 with continued reference to FIG. 1, impedance plots are shown for the AC coupling capacitor 140 and the narrow band regulator 150. The curve 700 is the impedance versus frequency response of the narrow band regulator 150. As shown in FIG. 7, the impedance of the narrow band regulator 150 is relatively low at low frequencies, increases with increasing frequency and levels off at a relatively high frequency. For example, the impedance of the narrow band regulator 150 is high above 500 kHz. Curves 710-1, 710-2 and 710-3 show the impedance versus frequency effects of the AC coupling capacitor 140 as the size (capacitance value) is increased. Specifically, as the capacitance of the AC coupling capacitor 140 is increased, the impedance of the signal path the AC coupling capacitor 140 provides into the differential TIA 110 more quickly decreases. Thus, FIG. 7 depicts that the intersection point between the impedance frequency response of the narrow band regulator 150 and the impedance frequency response of the AC coupling capacitor 140 is at a lower frequency as the size (capacitance value) of the AC coupling capacitor 140 is increased. The impedance through the AC coupling capacitor 140, which directs PD output current into the differential TIA 110, reduces with increasing frequency, and provides a lower impedance path for AC signal current (PD output current) to flow into the differential TIA 110. The more PD output current that flows through AC capacitor, the higher the SNR realized by the apparatus 100.

Figure 8:
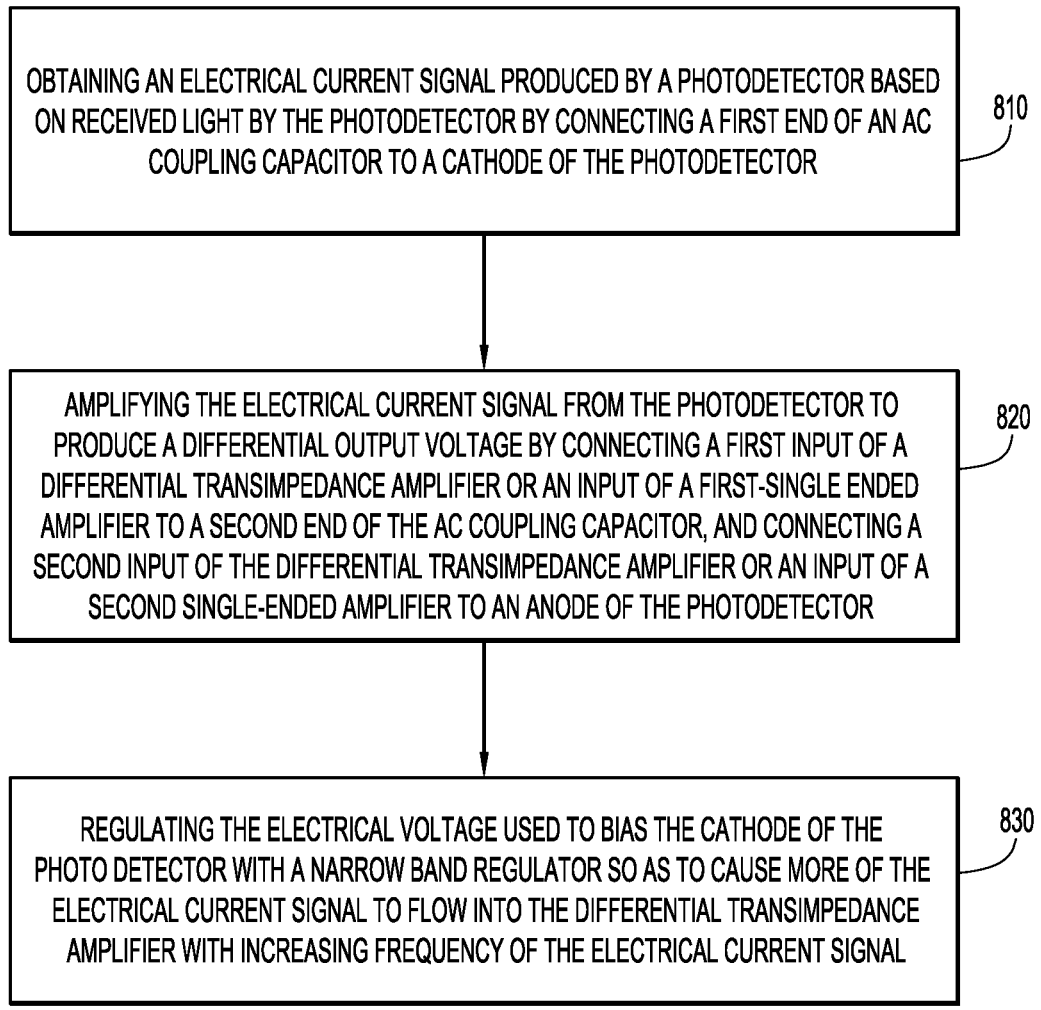
FIG. 8 is a flow chart of a method for amplifying output from a photodetector using asymmetric signal paths to a differential transimpedance amplifier, according to an example embodiment.

FIG. 8 illustrates a flow chart that depicts a method 800 for amplifying an electrical current signal from a photodiode (photodetector), according to the embodiments presented herein. At 810, the method includes obtaining an electrical current signal produced by a photodetector based on received light by the photodetector by connecting a first end of an AC coupling capacitor to a cathode of the photodetector. At 820, the method includes amplifying the electrical current signal from the photodetector to produce a differential output voltage by connecting a first input of a differential transimpedance amplifier to an input of a first single-ended amplifier (FIG. 2A) to a second end of the AC coupling capacitor, and connecting a second input of the differential transimpedance amplifier or to an input of a second single-ended amplifier (FIG. 2A) to an anode of the photodetector. At 830, the method includes regulating the electrical voltage used to bias the cathode of the photodetector with a narrow band regulator. The narrow band regulator has a frequency dependent impedance that increases with frequency so as to cause more of the electrical current signal to flow into the differential transimpedance amplifier with increasing frequency of the electrical current signal.

In summary, configurations are provided for asymmetric signal paths to a differential TIA to amplify output current of a photodetector or other device. The photodetector output current is reused in a complementary signal path/branch to increase the signal by 6 dB while the noise increases only by 3 dB, resulting in a net SNR improvement of 3 dB. The asymmetric signal paths are created by directly coupling the anode of the photodetector to a first input of the differential TIA and capacitively coupling the cathode of the photodetector to a second input of the differential TIA. In addition, a cascade-connected configuration of a wide band regulator and a narrow band regulator is employed to bias the cathode of the photodetector, resulting in wide bandwidth power-supply-rejection while offering high output-impedance across the over much of the signal bandwidth. The anode of the photodetector is self-biased by the signal differential TIA.

In one form, an apparatus is provided comprising: a first input and a second input, the first input to be coupled to a cathode of a photodetector and the second input to be coupled to an anode of the photodetector; an AC coupling capacitor coupled at a first end to the first input; a differential transimpedance amplifier having a first amplifier input connected to a second end of the AC coupling capacitor and a second amplifier input directly connected to the second input, the differential transimpedance amplifier configured to convert an output current of the photodetector obtained from the first amplifier input and the second amplifier input to a differential output voltage; and a narrow band regulator coupled to the first input, the narrow band regulator having a frequency dependent impedance that increases with frequency so as to cause more of the output current of the photodetector to flow into the differential transimpedance amplifier with increasing frequency of the output current of the photodetector.

The differential transimpedance amplifier may comprise: a pseudo-differential amplifier having two inputs corresponding to the first amplifier input and the second amplifier input, and a first output and a second output at which the differential output voltage is provided; or a first branch and a second branch, each of the first and second branches including an amplifier and a feedback resistor, wherein an output of the amplifier of the first branch is provided at a first output and an output of the amplifier of the second branch is provided at a second output, the first output and the second output providing the differential output voltage of the differential transimpedance amplifier.

The apparatus may further comprise: a current source configured to be coupled to the anode of the photodetector and to remove DC current from the anode of the photodetector; and a DC cancellation feedback circuit configured to be connected to the second output and to provide a DC current cancelling control to the current source. The apparatus may still further comprise: at least one differential programmable gain amplifier coupled to the first output and the second output of the differential transimpedance amplifier, and configured to amplify the differential output voltage to generate differential programmable gain outputs.

The apparatus may further comprise: an output buffer coupled to the differential programmable gain outputs of the at least one differential programmable gain amplifier, the output buffer configured to buffer the differential programmable gain outputs to provide a buffered differential output voltage at first and second differential outputs.

The apparatus may further comprise: at least one DC cancellation feedback circuit to be connected between one of the first and second differential outputs of the output buffer and the at least one differential programmable gain amplifier to provide a DC cancellation control to the at least one differential programmable gain amplifier.

The apparatus may further comprise: at least one differential programmable gain amplifier coupled to the first output and the second output of the differential transimpedance amplifier, and configured to amplify the differential output voltage to generate differential programmable gain outputs; an output buffer coupled to the differential programmable gain outputs of the at least one differential programmable gain amplifier, the output buffer configured to buffer the differential programmable gain outputs to provide a buffered differential output voltage at first and second differential outputs; a current source configured to be coupled to the anode of the photodetector and to remove DC current from the anode of the photodetector; and at least on DC cancellation feedback circuit configured to be connected between one of the first and second differential outputs of the output buffer and to provide a DC current cancelling control to the current source.

The apparatus may further comprise: a wide band regulator configured to be coupled between the narrow band regulator and a voltage supply, the wide band regulator configured to suppress noise of the voltage supply over a wide range of frequencies. The narrow band regulator and the wide band regulator may be coupled in a cascaded configuration between the cathode of the photodetector and the voltage supply, and bias the cathode of the photodetector so as to achieve wide band noise rejection from the voltage supply while providing a relatively high output impedance across a bandwidth of output current of the photodetector.

A capacitance value of the AC coupling capacitor determines an intersection of an impedance versus frequency curve of the AC coupling capacitor with an impedance versus frequency curve of the narrow band regulator.

In another form, an apparatus is provided comprising: a differential transimpedance amplifier having a first input and a second input, the differential transimpedance amplifier configured to convert a current signal supplied at the first input and the second input to a differential output voltage provided at a first output and a second output; and an AC coupling capacitor to be connected between the first input and a cathode of a photodetector; the second input to be directly connected to an anode of the photodetector; and a narrow band regulator to be coupled to the cathode of the photodetector, the narrow band regulator having a frequency dependent impedance that increases with frequency so as to cause more of the current signal output from the photodetector to flow into the differential transimpedance amplifier with increasing frequency of the current signal of the photodetector.

In still another form, a method is provided comprising: obtaining an electrical current signal produced by a photodetector based on received light by the photodetector by connecting a first end of an AC coupling capacitor to a cathode of the photodetector; amplifying the electrical current signal from the photodetector to produce a differential output voltage by connecting a first input of a differential transimpedance amplifier or an input of a first single-ended amplifier to a second end of the AC coupling capacitor and connecting a second input of the differential transimpedance amplifier or an input of a second single-ended amplifier to an anode of the photodetector; and regulating the electrical current signal into the differential transimpedance amplifier by connecting a narrow band regulator to the cathode of the photodetector so as to cause more of the electrical current signal to flow into the differential transimpedance amplifier with increasing frequency of the electrical current signal.

The method may further comprise: deriving a DC cancellation control from the differential output voltage; and using the DC cancellation control to remove DC current from the anode of the photodetector.

The method may still further comprise: increasing a capacitance value of the AC coupling capacitor to reduce a frequency at which an impedance versus frequency curve of the AC coupling capacitor intersects with an impedance versus frequency curve of the narrow band regulator.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
  a first input and a second input, the first input to be coupled to a cathode of a photodetector and the second input to be coupled to an anode of the photodetector;
  an AC coupling capacitor coupled at a first end to the first input;
  a differential transimpedance amplifier having a first amplifier input connected to a second end of the AC coupling capacitor and a second amplifier input directly connected to the second input, the differential transimpedance amplifier configured to convert an output current of the photodetector obtained from the first amplifier input and the second amplifier input to a differential output voltage; and
  a narrow band regulator coupled to the first input, the narrow band regulator having a frequency dependent impedance that increases with frequency so as to cause more of the output current of the photodetector to flow into the differential transimpedance amplifier with increasing frequency of the output current of the photodetector.

2. The apparatus of claim 1, wherein the differential transimpedance amplifier comprises:
  a pseudo-differential amplifier having two inputs corresponding to the first amplifier input and the second amplifier input, and a first output and a second output at which the differential output voltage is provided; or
  a first branch and a second branch, each of the first and second branches including an amplifier and a feedback resistor, wherein an output of the amplifier of the first branch is provided at a first output and an output of the amplifier of the second branch is provided at a second output, the first output and the second output providing the differential output voltage of the differential transimpedance amplifier.

3. The apparatus of claim 2, further comprising:
  a current source configured to be coupled to the anode of the photodetector and to remove DC current from the anode of the photodetector; and
  a DC cancellation feedback circuit configured to be connected to the second output and to provide a DC current cancelling control to the current source.

4. The apparatus of claim 3, further comprising:
  at least one differential programmable gain amplifier coupled to the first output and the second output of the differential transimpedance amplifier, and configured to amplify the differential output voltage to generate differential programmable gain outputs.

5. The apparatus of claim 4, further comprising:
  an output buffer coupled to the differential programmable gain outputs of the at least one differential programmable gain amplifier, the output buffer configured to buffer the differential programmable gain outputs to provide a buffered differential output voltage at first and second differential outputs.

6. The apparatus of claim 5, further comprising:
  at least one DC cancellation feedback circuit to be connected between one of the first and second differential outputs of the output buffer and the at least one differential programmable gain amplifier to provide a DC cancellation control to the at least one differential programmable gain amplifier.

7. The apparatus of claim 2, further comprising:
  at least one differential programmable gain amplifier coupled to the first output and the second output of the differential transimpedance amplifier, and configured to amplify the differential output voltage to generate differential programmable gain outputs;
  an output buffer coupled to the differential programmable gain outputs of the at least one differential programmable gain amplifier, the output buffer configured to buffer the differential programmable gain outputs to provide a buffered differential output voltage at first and second differential outputs;
  a current source configured to be coupled to the anode of the photodetector and to remove DC current from the anode of the photodetector; and
  at least on DC cancellation feedback circuit configured to be connected between one of the first and second differential outputs of the output buffer and to provide a DC current cancelling control to the current source.

8. The apparatus of claim 1, further comprising a wide band regulator configured to be coupled between the narrow band regulator and a voltage supply, the wide band regulator configured to suppress noise of the voltage supply over a wide range of frequencies.

9. The apparatus of claim 8, wherein the narrow band regulator and the wide band regulator are coupled in a cascaded configuration between the cathode of the photodetector and the voltage supply, and bias the cathode of the photodetector so as to achieve wide band noise rejection from the voltage supply while providing a relatively high output impedance across a bandwidth of output current of the photodetector.

10. The apparatus of claim 1, wherein a capacitance value of the AC coupling capacitor determines an intersection of an impedance versus frequency curve of the AC coupling capacitor with an impedance versus frequency curve of the narrow band regulator.

11. An apparatus comprising:
  a differential transimpedance amplifier having a first input and a second input, the differential transimpedance amplifier configured to convert a current signal supplied at the first input and the second input to a differential output voltage provided at a first output and a second output;
  an AC coupling capacitor to be connected between the first input and a cathode of a photodetector;
  the second input to be directly connected to an anode of the photodetector; and
  a narrow band regulator to be coupled to the cathode of the photodetector, the narrow band regulator having a frequency dependent impedance that increases with frequency so as to cause more of the current signal output from the photodetector to flow into the differential transimpedance amplifier with increasing frequency of the current signal of the photodetector.

12. The apparatus of claim 11, further comprising a wide band regulator configured to be coupled between the narrow band regulator and a voltage supply, the wide band regulator configured to suppress noise of the voltage supply.

13. The apparatus of claim 12, wherein the narrow band regulator and the wide band regulator are coupled in a cascaded configuration between the cathode of the photodetector and the voltage supply, and bias the cathode of the photodetector so as to achieve wide band noise rejection from the voltage supply while providing a relatively high output impedance across a bandwidth of current signal from the photodetector.

14. The apparatus of claim 11, further comprising:
  a current source configured to be coupled to the anode of the photodetector and to remove DC current from the anode of the photodetector; and a DC cancellation feedback circuit configured to be connected to the second output and to provide a DC current cancelling control to the current source.

15. The apparatus of claim 14, further comprising:
at least one differential programmable gain amplifier coupled to the first output and the second output of the differential transimpedance amplifier, and configured to amplify the differential output voltage to generate differential programmable gain outputs; and
an output buffer coupled to the differential programmable gain outputs of the at least one differential programmable gain amplifier, the output buffer configured to buffer the differential programmable gain outputs to provide a buffered differential output voltage at first and second differential outputs.

16. The apparatus of claim 15, further comprising:
at least one DC cancellation feedback circuit to be connected between one of the first and second differential outputs of the output buffer and the at least one differential programmable gain amplifier to provide a DC cancellation control to the at least one differential programmable gain amplifier.

17. The apparatus of claim 15, further comprising:
a current source configured to be coupled to the anode of the photodetector and to remove DC current from the anode of the photodetector; and
at least on DC cancellation feedback circuit configured to be connected between one of the first and second differential outputs of the output buffer and to provide a DC current cancelling control to the current source.

18. A method comprising:
obtaining an electrical current signal produced by a photodetector based on received light by the photodetector by connecting a first end of an AC coupling capacitor to a cathode of the photodetector;
amplifying the electrical current signal from the photodetector to produce a differential output voltage by connecting a first input of a differential transimpedance amplifier to a second end of the AC coupling capacitor and connecting a second input of the differential transimpedance amplifier to an anode of the photodetector; and
regulating the electrical current signal into the differential transimpedance amplifier by connecting a narrow band regulator to the cathode of the photodetector so as to cause more of the electrical current signal to flow into the differential transimpedance amplifier with increasing frequency of the electrical current signal.

19. The method of claim 18, further comprising:
deriving a DC cancellation control from the differential output voltage; and
using the DC cancellation control to remove DC current from the anode of the photodetector.

20. The method of claim 18, further comprising increasing a capacitance value of the AC coupling capacitor to reduce a frequency at which an impedance versus frequency curve of the AC coupling capacitor intersects with an impedance versus frequency curve of the narrow band regulator.

* * * * *